US010333745B1

(12) United States Patent
Ito

(10) Patent No.: US 10,333,745 B1
(45) Date of Patent: Jun. 25, 2019

(54) RECEIVING CIRCUIT

(71) Applicant: TOSHIBA MEMORY CORPORATION, Tokyo (JP)

(72) Inventor: Rui Ito, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/118,408

(22) Filed: Aug. 30, 2018

(30) Foreign Application Priority Data

Mar. 20, 2018 (JP) .................. 2018-053305

(51) Int. Cl.
| H04L 25/02 | (2006.01) |
| H03K 19/00 | (2006.01) |
| G01R 31/317 | (2006.01) |
| G01R 31/3187 | (2006.01) |
| G01R 31/319 | (2006.01) |
| H03K 19/0185 | (2006.01) |

(52) U.S. Cl.
CPC ...... *H04L 25/0292* (2013.01); *G01R 31/3187* (2013.01); *G01R 31/31715* (2013.01); *G01R 31/31924* (2013.01); *H03K 19/0005* (2013.01); *H03K 19/018557* (2013.01)

(58) Field of Classification Search
CPC .......... H04L 25/0292; G01R 31/31715; G01R 31/3187; G01R 31/31924; H03K 19/0005; H03K 19/018557; H03K 19/0175; H03K 19/017509; H03K 19/017545
USPC ......................................... 326/30
See application file for complete search history.

(56) References Cited

U.S. PATENT DOCUMENTS

| 6,288,564 B1 | 9/2001 | Hedberg |
| 8,138,813 B2 | 3/2012 | Inose |
| 8,497,696 B2 | 7/2013 | Reichel et al. |
| 8,867,592 B2 * | 10/2014 | Shrestha ............ H04L 25/0268 307/104 |
| 2013/0106485 A1 * | 5/2013 | Mukhopadhyay .......................... H03K 19/01850 327/333 |

FOREIGN PATENT DOCUMENTS

| JP | H11-308251 A | 11/1999 |
| JP | 3607639 B2 | 1/2005 |
| JP | 2008-060768 A | 3/2008 |

* cited by examiner

Primary Examiner — Daniel D Chang
(74) Attorney, Agent, or Firm — Kim & Stewart LLP

(57) ABSTRACT

A receiving circuit includes first and second input sections through which signals are to be received, first and second signal lines connected to the first and second input sections, respectively, a first circuit connected to the first and second signal lines and including a termination circuit and a self-test circuit, first and second capacitive elements that are provided in the first and second signal lines and configured to allow alternating-current components of the received signals to pass therethrough and interrupt at least direct-current components of the received signals from passing through, a second circuit that is connected to the first and second signal lines and configured to boost a gain of the received signals in a certain frequency band that have passed through the first and second capacitive elements, and first and second output sections through which the received signals boosted by the second circuit are output.

20 Claims, 7 Drawing Sheets

| TX_P | V1 | V3 |
|---|---|---|
| 0 | 1 | 1 |
| 1 | 0 | 0 |

| TX_N | V2 | V4 |
|---|---|---|
| 0 | 1 | 1 |
| 1 | 0 | 0 |

FIG. 5

| TX_P | V1 | V3 |
|---|---|---|
| 0 | 1 | 0 |
| 1 | 0 | 1 |

| TX_N | V2 | V4 |
|---|---|---|
| 0 | 1 | 0 |
| 1 | 0 | 1 |

RECEIVING CIRCUIT

CROSS-REFERENCE TO RELATED APPLICATIONS

This application is based upon and claims the benefit of priority from Japanese Patent Application No. 2018-053305, filed Mar. 20, 2018, the entire contents of which are incorporated herein by reference.

FIELD

Embodiments described herein relate generally to receiving circuits.

BACKGROUND

A data transfer interface conforming to the PCI Express® (hereinafter, PCIe®) standard uses a large-size AC coupling capacitive element, bypass switch, or the like in a receiving circuit for broadband signals of two or more generations. In the data transfer interface, properly setting frequency characteristics of the broadband signals is required.

DESCRIPTION OF THE DRAWINGS

FIG. 5 shows truth tables indicating relationship between input and output signals of a logic circuit in the receiving circuit according to the second embodiment;

DETAILED DESCRIPTION

Embodiments provide a receiving circuit with improved frequency characteristics for broadband signals.

In general, according to one embodiment, a receiving circuit includes first and second input sections through which signals are to be received, first and second signal lines that are connected to the first and second input sections, respectively, a first circuit connected to the first and second signal lines, wherein the first circuit further includes a termination circuit configured to set input impedances of the first and second input sections to a particular value and a self-test circuit configured to generate self-test signals and transmit the self-test signals to the first and second signal lines, first and second capacitive elements that are provided in the first and second signal lines, respectively and configured to allow alternating-current components of the received signals to pass therethrough and interrupt at least direct-current components of the received signals from passing through, a second circuit connected to the first and second signal lines and configured to boost a gain of the received signals in a certain frequency band that have passed through the first and second capacitive elements, and first and second output sections through which the received signals boosted by the second circuit are output.

Hereinafter, embodiments will be described with reference to the drawings. The following embodiments are not intended to be limiting. The drawings are schematic and/or conceptual and the ratio between the portions, for instance, is not always identical to the actual ratio. In the specification and drawings, elements which are similar to those described in connection with the already explained drawings are identified with the same reference signs and detailed explanations thereof will be omitted as appropriate.

First Embodiment

Figure 1:
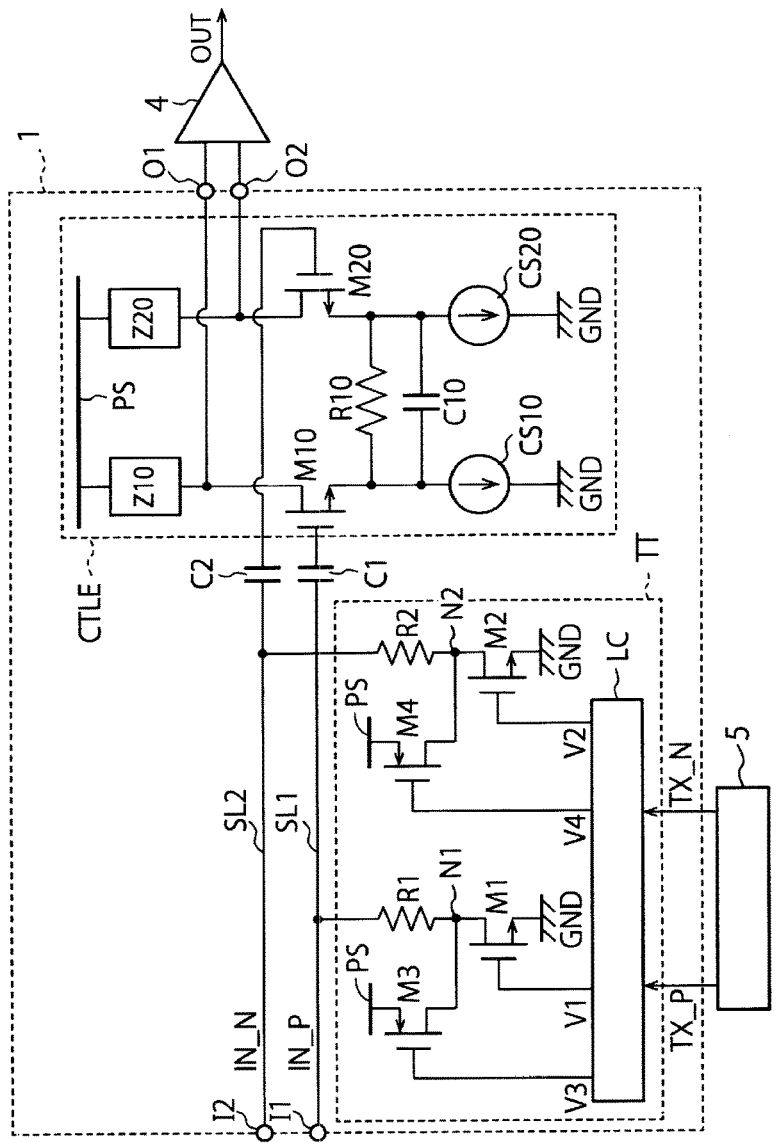
FIG. 1 is a block diagram depicting a receiving circuit according to a first embodiment.

FIG. 1 is a block diagram depicting a receiving circuit 1 according to a first embodiment. The receiving circuit 1 is, for example, a data transfer interface that receives a signal from an external device (for example, a host device) of the receiving circuit 1 and transfers data which correspond to the received signal to an amplifier 4, and conforms to the PCIe standard. The receiving circuit 1 is configured so as to be capable of receiving signals in a wide frequency band corresponding to generations G1 to G4 of PCIe, for example.

Data from the external device of the receiving circuit 1 is sent to the receiving circuit 1 as a high-frequency signal. The amplifier 4 amplifies a signal difference of the signals output from the receiving circuit 1. An internal circuit (not depicted in the drawing) performs signal processing by identifying the logic of the signal amplified by the amplifier 4. The internal circuit includes, for example, a memory controller or a memory device. The memory device may be, for example, a nonvolatile flash memory having a three-dimensional memory cell array in which memory cells are three-dimensionally arranged or a NAND flash memory in which memory cells are two-dimensionally arranged.

The receiving circuit 1 may be integrated into one and the same semiconductor package or one and the same semiconductor chip. Alternatively, the receiving circuit 1 may be integrated into one and the same semiconductor package or one and the same semiconductor chip with at least part of the amplifier 4, a transmitting circuit 5, and the internal circuit.

The receiving circuit 1 includes first and second input sections I1 and I2, first and second signal lines SL1 and SL2, a termination/test circuit TT, first and second AC coupling capacitive elements C1 and C2, a compensation circuit (e.g., continuous time linear equalizer; hereinafter CTLE), and first and second output sections O1 and O2.

The first and second input sections I1 and I2 receive, from the external device, received signals IN_P and IN_N of different polarities. The first and second input sections I1 and I2 may be input terminals or each may be one end of a corresponding one of the first and second signal lines SL1 and SL2.

The first and second signal lines SL1 and SL2 are connected to the first and second input sections I1 and I2, respectively, and transfer the received signals IN_P and IN_N. The first and second signal lines SL1 and SL2 are connected to gate electrodes of transistors M10 and M20, respectively, of the compensation circuit CTLE via the first and second AC coupling capacitive elements C1 and C2, respectively.

The first and second AC coupling capacitive elements C1 and C2 are provided at some point along the first and second signal lines SL1 and SL2. The first and second AC coupling capacitive elements C1 and C2 allow alternating-current components (e.g., high-frequency components) of the received signals IN_P and IN_N to pass therethrough and curb transfer of direct-current components of the received signals IN_P and IN_N. As a result, the first and second signal lines SL1 and SL2 transfer, to the compensation circuit CTLE, the alternating-current components of the received signals IN_P and IN_N from which the direct-current components are removed. The first and second AC coupling capacitive elements C1 and C2 have somewhat large capacitance so as to be capable of allowing signals in a wide frequency band from low to high frequencies, which corresponds to the generations G1 to G4 of PCIe, for example, to pass therethrough.

The compensation circuit CTLE is connected to the first and second signal lines SL1 and SL2 and compensates for the strength (e.g., gain) of the received signals IN_P and IN_N in a high frequency band, for example, by boosting the strength (e.g., gain) thereof. As a result, the compensation circuit CTLE can amplify a signal difference (e.g., a voltage difference) between the received signals IN_P and IN_N not only in a low frequency band, but also in a high frequency band, and then output the resultant signals from the first and second output sections O1 and O2. It is to be noted that compensating for signals means bringing the strength (e.g., gain) of broadband signals closer to a constant level by amplifying (or boosting) a signal difference in a specific frequency band. That is, compensating for signals in an example given herein, means compensating for a loss of frequency characteristics, such as gain, in certain frequency bands.

The compensation circuit CTLE includes loads Z10 and Z20, the N-type transistors M10 and M20, constant current sources CS10 and CS20, a resistance element R10, and a capacitive element C10. The load Z10, the N-type transistor M10, and the constant current source CS10 are connected in series between a power supply PS and a ground GND. The load Z20, the N-type transistor M20, and the constant current source CS20 are also connected in series between the power supply PS and the ground GND, and are connected in parallel with a current path of the load Z10, the N-type transistor M10, and the constant current source CS10. The resistance element R10 and the capacitive element C10 are connected in parallel with each other between the source of the transistor M10 and the source of the transistor M20. The drain of the transistor M10 and the drain of the transistor M20 are connected to the first and second output sections O1 and O2, respectively. As a result, drain voltages of the transistors M10 and M20 are output from the first and second output sections O1 and O2, respectively. As described above, the compensation circuit CTLE functions as a differential circuit of the received signals IN_P and IN_N and performs waveform shaping of the received signals IN_P and IN_N.

The termination/test circuit TT is connected to the first and second signal lines SL1 and SL2. The termination/test circuit TT has a termination function of setting the input impedance of the first and second input sections I1 and I2 at ohms, for example. In addition thereto, the termination/test circuit TT has a self-test (built-in self-test (BIST)) function of conducting a test by inputting, to the first and second signal lines SL1 and SL2, signals based on transmitted signals TX_P and TX_N from the transmitting circuit 5 provided in one and the same circuit, one and the same chip, or one and the same device, with the receiving circuit 1.

The termination/test circuit TT includes first to fourth transistors M1 to M4, first and second resistance elements R1 and R2, and a logic circuit LC. The first resistance element R1 and the first transistor M1 are connected in series between the first signal line SL1 and the ground GND. The second resistance element R2 and the second transistor M2 are connected in series between the second signal line SL2 and the ground GND. The resistance values of the first and second resistance elements R1 and R2 are, for example, 50 ohms.

The third transistor M3 is connected between a first node N1, which is located between the first resistance element R1 and the first transistor M1, and the power supply PS. The fourth transistor M4 is connected between a second node N2, which is located between the second resistance element R2 and the second transistor M2, and the power supply PS.

In the present embodiment, the first and second transistors M1 and M2 are N-type metal oxide semiconductor field-effect transistors (MOSFETs). The third and fourth transistors M3 and M4 are P-type MOSFETs. Thus, the first and third transistors M1 and M3 function as an inverter and the second and fourth transistors M2 and M4 also function as an inverter.

In a normal operation in which the receiving circuit 1 receives data from the external device, the first and second transistors M1 and M2 are in a conductive state and the third and fourth transistors M3 and M4 are in a non-conductive state. As a result, the first and second resistance elements R1 and R2 are connected between the first signal line SL1 and the ground GND and between the second signal line SL2 and the ground GND, respectively, and set the input impedance at 50 ohms. That is, in the normal operation, the termination/test circuit TT functions as a termination circuit.

On the other hand, when the receiving circuit 1 executes the BIST function, the first and third transistors M1 and M3 function as an inverter by operating in a complementary manner by common-mode signals V1 and V3 generated by the logic circuit LC based on the transmitted signal TX_P. As a result, the first and third transistors M1 and M3 can transfer a high-level voltage (in this example, a power supply voltage) or a low-level voltage (in this example, a ground voltage) to the first signal line SL1 in accordance with the transmitted signal TX_P. Moreover, the second and fourth transistors M2 and M4 function as an inverter by operating in a complementary manner by common-mode signals V2 and V4 generated by the logic circuit LC based on the transmitted signal TX_N. As a result, the second and fourth transistors M2 and M4 can transfer a high-level voltage (in this example, a power supply voltage) or a low-level voltage (in this example, a ground voltage) to the second signal line SL2 in accordance with the transmitted signal TX_N.

The transmitted signals TX_P and TX_N are transmitted signals from the transmitting circuit 5 and are signals of which one has a logic level which is the inverse of the logic level of the other. The termination/test circuit TT inputs signals based on the transmitted signals TX_P and TX_N to the first and second signal lines SL1 and SL2 on a trial basis and tests the reception function of the receiving circuit 1 and the like. Inputting the transmitted signals TX_P and TX_N from the transmitting circuit 5 to the receiving circuit 1 in this manner is also referred to as internal loop back (ILB). The receiving circuit 1 according to the first embodiment executes the above-described BIST function by using ILB.

The logic circuit LC is connected to the gate electrodes of the first to fourth transistors M1 to M4 and applies the signals V1 to V4 to the gate electrodes of the first to fourth transistors M1 to M4 based on the transmitted signals TX_P and TX_N from the transmitting circuit 5. In the present embodiment, the logic circuit LC outputs a signal of the same logic value (e.g., first logic) to the gate electrodes of the first and third transistors M1 and M3 based on the transmitted signal TX_P and outputs a signal of the same logic value (e.g., second logic) to the gate electrodes of the second and fourth transistors M2 and M4 based on the transmitted signal TX_N. The first logic and the second logic are signals of which one has a logic level which is the inverse of the logic level of the other. As a result, in the BIST function, the logic circuit LC makes the first and third transistors M1 and M3 operate in a complementary manner and makes the second and fourth transistors M2 and M4 operate in a complementary manner. As described above, the first and third transistors M1 and M3 function as an inverter and the second and fourth transistors M2 and M4 function as an inverter. It is to be noted that the logic circuit LC may only output one of the signals V1 and V3 and output one of the signals V2 and V4. In this case, wiring may be carried out so that one of the signals V1 and V3 to be output is connected to the gate electrodes of the first and third transistors M1 and M3 and one of the signals V2 and V4 to be output is connected to the gate electrodes of the second and fourth transistors M2 and M4.

Moreover, the above-described transmitted signals TX_P and TX_N are signals of opposite phase. Therefore, the logic circuit LC makes the first and second transistors M1 and M2 concurrently operate in a complementary manner and makes the third and fourth transistors M3 and M4 concurrently operate in a complementary manner. This allows the termination/test circuit TT to make the inverter configured with the first and third transistors M1 and M3 and the inverter configured with the second and fourth transistors M2 and M4 alternately operate at frequencies based on the frequencies of the transmitted signals TX_P and TX_N and apply a high-level voltage and a low-level voltage in accordance with the transmitted signals TX_P and TX_N to the first and second signal lines SL1 and SL2.

Figures 2, 3:
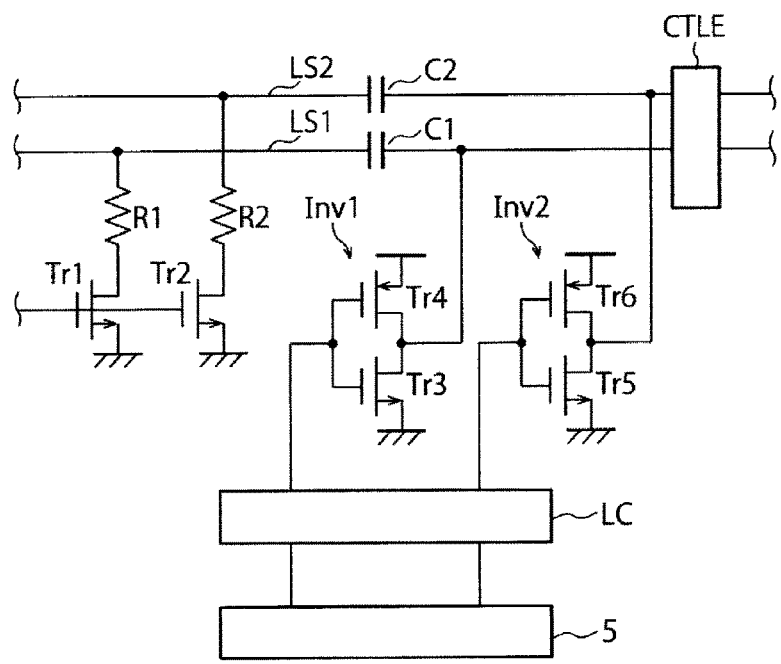
FIG. 2 shows truth tables indicating relationship between input and output signals of a logic circuit in the receiving circuit according to the first embodiment.
FIG. 3 is a diagram depicting a receiving circuit of a comparative example in which a termination circuit and a BIST (built-in self-test) circuit are separately provided.

FIG. 2 shows truth tables indicating the relationship between the transmitted signal TX_P and the signals V1 and V3 and the relationship between the transmitted signal TX_N and the signals V2 and V4. The logic circuit LC has a circuit that is configured in accordance with these truth tables. The circuit configuration itself is not limited to a particular circuit configuration as long as the circuit configuration adheres to these truth tables. The transmitted signals TX_P and TX_N are output from the transmitting circuit 5 as signals of which one has a logic level which is the inverse of the logic level of the other and are input to the termination/test circuit TT of the receiving circuit 1.

The signals V1 and V3 are common-mode signals which are determined by the logic of the transmitted signal TX_P. For example, when the transmitted signal TX_P is data "0 (more generally, first logic)", the signals V1 and V3 become data "1 (more generally, second logic)"; when the transmitted signal TX_P is data "1", the signals V1 and V3 become data "0".

When the signals V1 and V3 are data "1", the first transistor M1 of FIG. 1 enters a conductive state and the third transistor M3 enters a non-conductive state. As a result, the first signal line SL1 is connected to the ground GND and becomes a low-level voltage. When the signals V1 and V3 are data "0", the third transistor M3 enters a conductive state and the first transistor M1 enters a non-conductive state. As a result, the first signal line SL1 is connected to the power supply PS and becomes a high-level voltage.

The signals V2 and V4 are common-mode signals which are determined by the logic of the transmitted signal TX_N. When the transmitted signal TX_N is data "0", the signals V2 and V4 become data "1"; when the transmitted signal TX_N is data "1", the signals V2 and V4 become data "0".

When the signals V2 and V4 are data "1", the second transistor M2 of FIG. 1 enters a conductive state and the fourth transistor M4 enters a non-conductive state. As a result, the second signal line SL2 is connected to the ground GND and becomes a low-level voltage. When the signals V2 and V4 are data "0", the fourth transistor M4 enters a conductive state and the second transistor M2 enters a non-conductive state. As a result, the second signal line SL2 is connected to the power supply PS and becomes a high-level voltage.

As described above, the logic circuit LC can make the first to fourth transistors M1 to M4 operate based on the transmitted signals TX_P and TX_N.

In the test operation using the BIST function, the termination/test circuit TT can transfer, as the received signals IN_P and IN_N, signals based on the transmitted signals TX_P and TX_N to the first and second signal lines SL1 and SL2 via the logic circuit LC in place of data from the external device. On the other hand, in the normal operation in which data from the external device is received, the termination/test circuit TT can connect the first and second resistance elements R1 and R2 between the first signal line SL1 and the ground GND and between the second signal line SL2 and the ground GND, respectively, and terminate the input impedance at a predetermined value (for example, 50 ohms). That is, the termination/test circuit TT has both the termination function and the BIST function.

Here, the first and second transistors M1 and M2 are used as component elements of the termination circuit and also used as component elements of a circuit configured with the BIST function (hereinafter also referred to as a BIST circuit). That is, the first and second transistors M1 and M2 are used in both the termination circuit and the BIST circuit.

If the termination circuit and the BIST circuit are separately provided, as depicted in FIG. 3, inverter circuits Inv1 and Inv2 which are used in the BIST function are needed separately from transistors Tr1 and Tr2 of the termination circuit. The inverter circuit Inv1 includes transistors Tr3 and Tr4 and the inverter circuit Inv2 includes transistors Tr5 and Tr6. FIG. 3 is a diagram depicting a receiving circuit of a comparative example in which the termination circuit and the BIST circuit are separately provided. In this case, the transistors of the termination circuit and the BIST circuit are Tr1 to Tr6 and the number of transistors is 6, which is greater than the number of transistors (M1 to M4) in the termination/test circuit TT according to the present embodiment by 2. Moreover, in the BIST function, a test of the receiving circuit 1 and the like has to be conducted by receiving the transmitted signals TX_P and TX_N of various frequencies. Thus, the transistors Tr3 to Tr6 are designed so as to have a relatively large size (gate width/gate length). Furthermore, since the resistance elements R1 and R2 are connected to the ground GND by resistance value of below 50 ohm, the transistors Tr1 and Tr2 of the termination circuit are also designed so as to have a large size so that a relatively large current can be passed therethrough. In this case, the transistors Tr1 to Tr6 can cause large parasitic capacitance. Therefore, if the termination circuit and the BIST circuit are separately provided, the layout area of the entire receiving circuit is increased and the parasitic capacitance of the first and second signal lines SL1 and SL2 becomes large.

By contrast, in the receiving circuit 1 according to the present embodiment, the first and second transistors M1 and M2 are used in both the termination circuit and the BIST circuit. As a result, the number of transistors in the termination/test circuit TT according to the present embodiment is smaller than that of the comparative example depicted in FIG. 3 by 2. As mentioned above, since the size of the transistors (Tr1 to Tr6) of the termination circuit and the BIST circuit employed in the comparative example, is large, the receiving circuit 1 according to the present embodiment can greatly reduce the layout area and the parasitic capacitance of the entire receiving circuit.

Next, an operation of the receiving circuit 1 according to the present embodiment will be described.

(BIST Function)

In the BIST function, by using the transmitted signals TX_P and TX_N from the transmitting circuit 5, the logic circuit LC generates the signals V1 to V4. The logic circuit LC makes the inverter configured with the first and third transistors M1 and M3 and the inverter configured with the second and fourth transistors M2 and M4 operate. Since the transmitted signals TX_P and TX_N are signals of opposite phase, the first to fourth transistors M1 to M4 apply a high-level voltage and a low-level voltage alternately to the first and second signal lines SL1 and SL2 at frequencies based on the frequencies of the transmitted signals TX_P and TX_N. As a result, a test as to whether or not the receiving circuit 1, the amplifier 4, and so forth are operating normally can be conducted.

(Normal Operation)

After the test conducted by the BIST function, in the normal operation, the receiving circuit 1 receives data from the external device as the received signals IN_P and IN_N. At this time, the logic circuit LC makes the first and second transistors M1 and M2 enter a conductive state and the third and fourth transistors M3 and M4 enter a non-conductive state. As a result, as the termination circuit, the termination/test circuit TT sets the input impedance of the first and second signal lines SL1 and SL2 at a predetermined value (50 ohms).

As described above, according to the present embodiment, the first and second transistors M1 and M2 are used in both the termination circuit and the BIST circuit. As a result, the number of transistors in the termination/test circuit TT according to the present embodiment becomes relatively small, the layout area of the entire receiving circuit 1 is reduced, and the parasitic capacitance of the first and second signal lines SL1 and SL2 is reduced. Moreover, the capacitance of the first and second AC coupling capacitive elements C1 and C2 is set at a magnitude corresponding to the generations G1 to G4 of PCIe. Therefore, the receiving circuit 1 can receive broadband signals. That is, the receiving circuit 1 can reduce parasitic capacitance and reduce a loss of frequency characteristics for broadband signals.

Second Embodiment

Figure 4:
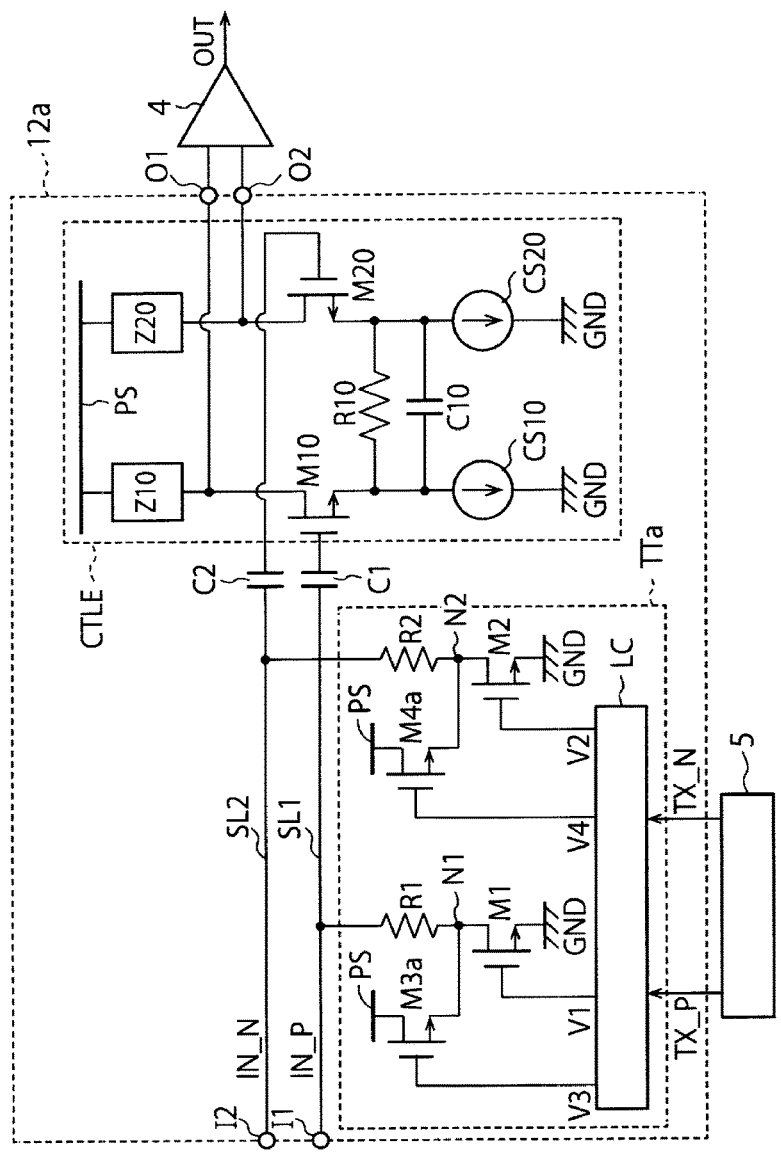
FIG. 4 is a block diagram depicting a receiving circuit according to a second embodiment.

FIG. 4 is a block diagram depicting a receiving circuit 12a according to a second embodiment. The second embodiment differs from the first embodiment in that third and fourth transistors M3a and M4a are configured as N-type MOSFETs. That is, in the second embodiment, all of the first to fourth transistors M1, M2, M3a, and M4a are N-type MOSFETs. On the other hand, a logic circuit LC is configured so as to make the first to fourth transistors M1, M2, M3a, and M4a operate in a manner similar to the operations thereof in the first embodiment. Truth tables of the logic circuit LC are shown in FIG. 5.

Figure 5:
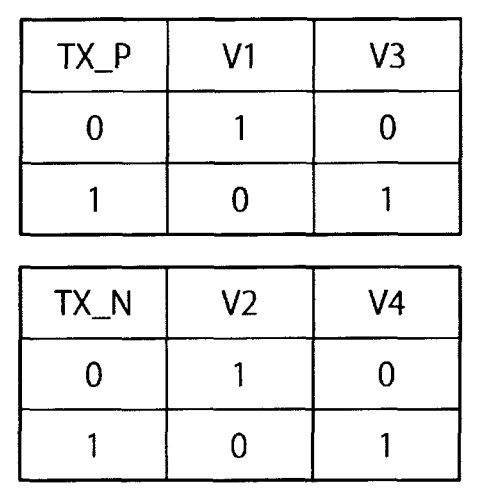

FIG. 5 shows truth tables indicating the relationship between the transmitted signal TX_P and the signals V1 and V3 and the relationship between the transmitted signal TX_N and the signals V2 and V4 according to the second embodiment. The logic circuit LC has a circuit configured in accordance with these truth tables. The circuit configuration itself is not limited to a particular circuit configuration as long as the circuit configuration adheres to these truth tables.

According to the second embodiment, the signals V1 and V3 are a pair of first signals opposite in polarity which are determined by the logic of the transmitted signal TX_P. For example, when the transmitted signal TX_P is data "0", the signals V1 and V3 are data "1" and data "0", respectively; when the transmitted signal TX_P is data "1", the signals V1 and V3 are data "0" and data "1", respectively.

When the signals V1 and V3 are data "1" and data "0", respectively, the first transistor M1 of FIG. 4 enters a conductive state and the third transistor M3a enters a non-conductive state. As a result, the first signal line SL1 is connected to the ground GND and becomes a low-level voltage. When the signals V1 and V3 are data "0" and data "1", respectively, the third transistor M3a enters a conductive state and the first transistor M1 enters a non-conductive state. As a result, the first signal line SL1 is connected to the power supply PS and becomes a high-level voltage.

The signals V2 and V4 are a pair of second signals opposite in polarity which are determined by the logic of the transmitted signal TX_N. When the transmitted signal TX_N is data "0", the signals V2 and V4 become data "1" and data "0", respectively; when the transmitted signal TX_N is data "1", the signals V2 and V4 become data "0" and data "1", respectively.

When the signals V2 and V4 are data "1" and data "0", respectively, the second transistor M2 of FIG. 4 enters a conductive state and the fourth transistor M4a enters a non-conductive state. As a result, the second signal line SL2 is connected to the ground GND and becomes a low-level voltage. When the signals V2 and V4 are data "0" and data "1", respectively, the fourth transistor M4a enters a conductive state and the second transistor M2 enters a non-conductive state. As a result, the second signal line SL2 is connected to the power supply PS and becomes a high-level voltage.

As described above, according to the second embodiment, although the conductivity type of the third and fourth transistors M3a and M4a and the configuration of the logic circuit LC are different from those of the first embodiment, the operations themselves of the first to fourth transistors M1, M2, M3a, and M4a are similar to those of the first embodiment. The other configurations of the second embodiment may be similar to the corresponding configuration of the first embodiment. Therefore, the second embodiment can obtain the effects similar to those of the first embodiment.

Third Embodiment

Figure 6:
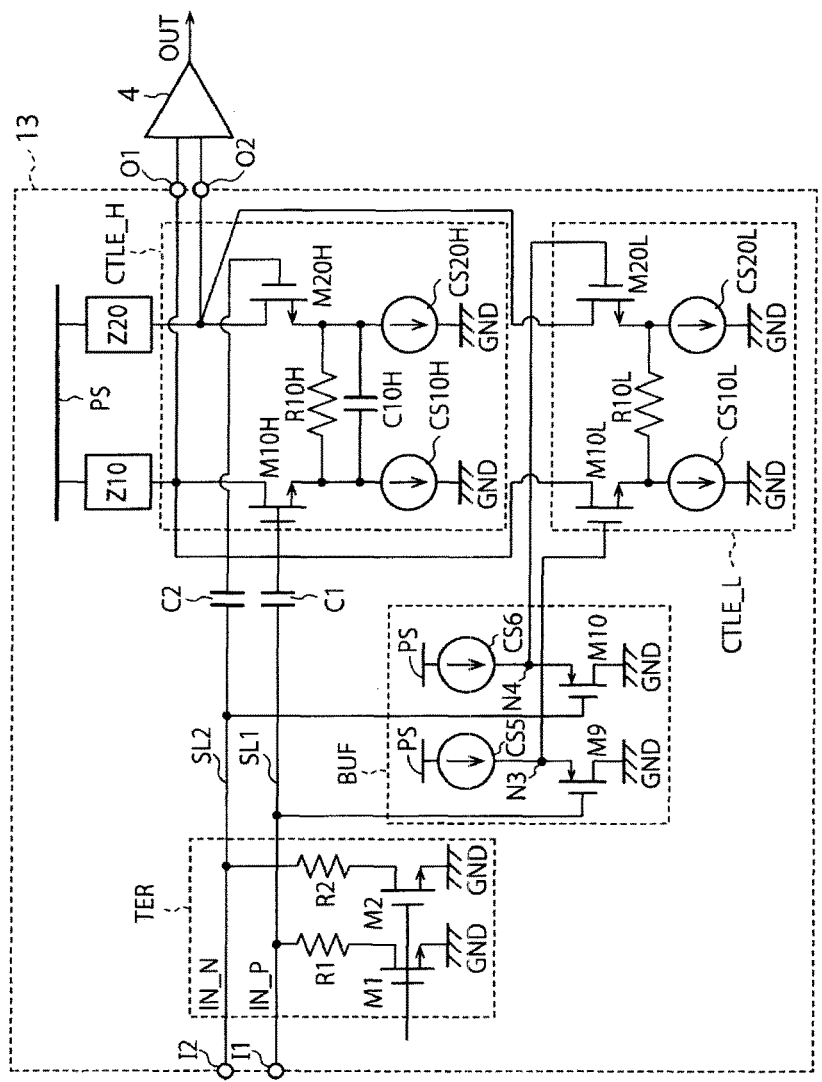
FIG. 6 is a block diagram depicting a receiving circuit according to a third embodiment.

FIG. 6 is a block diagram depicting a receiving circuit 13 according to a third embodiment. In the third embodiment, a compensation circuit is divided into two compensation circuits: first and second compensation circuits CTLE_H and CTLE_L for each frequency band. The receiving circuit 13 according to the third embodiment includes at least the first compensation circuit CTLE_H, the second compensation circuit CTLE_L, a buffer circuit BUF, and a termination circuit TER.

The first compensation circuit CTLE_H is connected between the power supply PS and the ground GND. The first compensation circuit CTLE_H receives the received signals IN_P and IN_N in a high frequency band from the first and second signal lines SL1 and SL2 via the first and second AC coupling capacitive elements C1 and C2 and compensates for the strength (e.g., gain) of the received signals IN_P and IN_N in a high frequency band by boosting the strength (e.g., gain) thereof. As a result, the first compensation circuit CTLE_H compensates for a signal difference (e.g., a voltage difference) between the received signals IN_P and IN_N in a high frequency band and outputs the resultant signals from the first and second output sections O1 and O2.

The first compensation circuit CTLE_H includes N-type transistors M10H and M20H, constant current sources CS10H and CS20H, a resistance element R10H, and a capacitive element C10H. The load Z10, the N-type transistor M10H, and the constant current source CS10H are connected in series between the power supply PS and the ground GND. The load Z20, the N-type transistor M20H, and the constant current source CS20H are also connected in series between the power supply PS and the ground GND, and are connected in parallel with a current path of the load Z10, the N-type transistor M10H, and the constant current source CS10H. The resistance element R10H and the capacitive element C10H are connected in parallel with each other between the source of the transistor M10H and the source of the transistor M20H. The drain of the transistor M10H and the drain of the transistor M20H are connected to the first and second output sections O1 and O2, respectively. Furthermore, the gate electrode of the transistor M10H is connected to the first signal line SL1. The gate electrode of the transistor M20H is connected to the second signal line SL2. As a result, drain voltages of the transistors M10H and M20H are output from the first and second output sections O1 and O2. As described above, the compensation circuit CTLE_H functions as a differential circuit of the received signals IN_P and IN_N and performs waveform shaping of the received signals IN_P and IN_N in, in particular, a high frequency band.

The second compensation circuit CTLE_L is connected in parallel with the first compensation circuit CTLE_H between the power supply PS and the ground GND. The second compensation circuit CTLE_L receives the received signals IN_P and IN_N in a low frequency band from the first and second signal lines SL1 and SL2 without the first and second AC coupling capacitive elements C1 and C2 and compensates for the strength (e.g., gain) of the received signals IN_P and IN_N in a low frequency band by boosting the strength (e.g., gain) thereof. As a result, the second compensation circuit CTLE_L compensates for a signal difference (e.g., a voltage difference) between the received signals IN_P and IN_N in a low frequency band and outputs the resultant signals from the first and second output sections O1 and O2.

The second compensation circuit CTLE_L includes N-type transistors M10L and M20L, constant current sources CS10L and CS20L, and a resistance element R10L. The load Z10, the N-type transistor M10L, and the constant current source CS10L are connected in series between the power supply PS and the ground GND. The load Z20, the N-type transistor M20L, and the constant current source CS20L are also connected in series between the power supply PS and the ground GND, and are connected in parallel with a current path of the load Z10, the N-type transistor M10L, and the constant current source CS10L. The resistance element R10L is connected between the source of the transistor M10L and the source of the transistor M20L. The drain of the transistor M10L and the drain of the transistor M20L are connected to the first and second output sections O1 and O2, respectively. Furthermore, the gate electrode of the transistor M10L is connected to the first signal line SL1 via the buffer circuit BUF. The gate electrode of the transistor M20L is connected to the second signal line SL2 via the buffer circuit BUF. As a result, drain voltages of the transistors M10L and M20L are output from the first and second output sections O1 and O2. As described above, the compensation circuit CTLE_L functions as a differential circuit of the received signals IN_P and IN_N and performs waveform shaping of the received signals IN_P and IN_N in, in particular, a low frequency band.

As described above, the second compensation circuit CTLE_L is connected in parallel with the first compensation circuit CTLE_H between the power supply PS and the ground GND. The received signals IN_P and IN_N in a high frequency band are compensated for by the first compensation circuit CTLE_H via the first and second AC coupling capacitive elements C1 and C2. The received signals IN_P and IN_N in a low frequency band are compensated for by the second compensation circuit CTLE_L without the first and second AC coupling capacitive elements C1 and C2. That is, the first and second AC coupling capacitive elements C1 and C2 only have to allow signals in a high frequency band to pass therethrough and may interrupt signals in a low frequency band including direct-current components. Therefore, the first and second AC coupling capacitive elements C1 and C2 do not have to be large capacitive elements that allow broadband signals including signals in a low frequency band to pass therethrough and can be small capacitive elements that allow signals in a high frequency band to pass therethrough. As a result, the parasitic capacitance and the layout area of the receiving circuit 13 can be reduced.

The buffer circuit BUF is connected between the first and second signal lines SL1 and SL2 and the second compensation circuit CTLE_L. The buffer circuit BUF functions as a buffer that transfers the received signals IN_P and IN_N in a low frequency band to the second compensation circuit CTLE_L.

The buffer circuit BUF includes P-type transistors M9 and M10 and constant current sources CS5 and CS6. The constant current source CS5 and the transistor M9 are connected in series between the power supply PS and the ground GND. The gate electrode of the transistor M9 is connected to the first signal line SL1 between the first input section I1 and the first AC coupling capacitive element C1. A third node N3 between the constant current source CS5 and the transistor M9 is connected to the gate electrode of the transistor M10L. The constant current source CS6 and the transistor M10 are connected in series between the power supply PS and the ground GND. The gate electrode of the transistor M10 is connected to the second signal line SL2 between the second input section I2 and the second AC coupling capacitive element C2. A fourth node N4 between the constant current source CS6 and the transistor M10 is connected to the gate electrode of the transistor M20L.

As described above, the gates of the transistors M9 and M10 are respectively connected to the first signal line SL1 between the first input section I1 and the first AC coupling capacitive element C1 and the second signal line SL2 between the second input section I2 and the second AC coupling capacitive element C2. Therefore, the received signals IN_P and IN Nina low frequency band are input to the gate electrodes of the transistors M9 and M10 before being interrupted by the first and second AC coupling capacitive elements C1 and C2. As a result, the transistors M9 and M10 receive the received signals IN_P and IN_N in a low frequency band and operate with a gain of 1. On the other hand, the transistors M9 and M10 do not have to operate with a gain of 1 for the received signals IN_P and IN_N in a high frequency band. This is because the received signals IN_P and IN_N in a high frequency band are amplified by the first compensation circuit CTLE_H, which is configured so as to be connected in parallel therewith, and transferred to the outputs. Thus, the buffer circuit BUF interrupts the received signals IN_P and IN_N in a high frequency band and transfers the received signals IN_P and IN_N in a low frequency band to the second compensation circuit CTLE_L with a gain of 1.

The termination circuit TER is connected to the first and second signal lines SL1 and SL2. The termination circuit TER includes resistance elements R1 and R2 and N-type transistors M1 and M2. The connection relationship between the resistance element R1 and the transistor M1 may be similar to the connection relationship between those of the first embodiment. The connection relationship between the resistance element R2 and the transistor M2 may also be similar to the connection relationship between those of the first embodiment. As a result, the termination circuit TER sets the input impedance of the first and second input sections I1 and I2 at a predetermined value (for example, 50 ohms). It is to be noted that, in the third embodiment, the transistors M3 and M4 depicted in FIG. 1 are not provided.

The other configuration of the third embodiment may be similar to the corresponding configuration of the first or second embodiment. When the termination/test circuit TT or TTa of the first or second embodiment is applied to the third embodiment, in place of the termination circuit TER depicted in FIG. 6, the termination/test circuit TT depicted in FIG. 1 or the termination/test circuit TTa depicted in FIG. 4 is provided. It is to be noted that, in the third embodiment, a BIST circuit is not depicted in the drawing. The configuration of the BIST circuit of the third embodiment may be the inverter circuits Inv1 and Inv2 depicted in FIG. 3 or may be the termination/test circuit TT or TTa of the first or second embodiment.

Next, an operation of the receiving circuit 13 according to the third embodiment will be described.

Components of the received signals IN_P and IN_N in a high frequency band pass through the first and second AC coupling capacitive elements C1 and C2 and are input to the first compensation circuit CTLE_H. On the other hand, since the received signals IN_P and IN_N in a high frequency band are interrupted by the buffer circuit BUF, the received signals IN_P and IN_N in a high frequency band are not input to the second compensation circuit CTLE_L. As a result, the first compensation circuit CTLE_H compensates for the received signals IN_P and IN_N in a high frequency band by amplifying the received signals IN_P and IN_N in a high frequency band and performs waveform shaping of the received signals IN_P and IN_N in a high frequency band.

Components of the received signals IN_P and IN_N in a low frequency band are interrupted by the first and second AC coupling capacitive elements C1 and C2 and are not input to the first compensation circuit CTLE_H. On the other hand, the received signals IN_P and IN_N in a low frequency band are transferred to the second compensation circuit CTLE_L via the buffer circuit BUF. As a result, the second compensation circuit CTLE_L compensates for the received signals IN_P and IN Nina low frequency band by amplifying the received signals IN_P and IN_N in a low frequency band and performs waveform shaping of the received signals IN_P and IN_N in a low frequency band.

The first and second compensation circuits CTLE_H and CTLE_L are connected in parallel between the loads Z10 and Z20 and the ground GND and share the first and second output sections O1 and O2. That is, the sum of the output signals from the first and second compensation circuits CTLE_H and CTLE_L is output from the first and second output sections O1 and O2. Therefore, as the components of the received signals IN_P and IN_N in a high frequency band, the output signals from the first compensation circuit CTLE_H are dominant, and, as the components of the received signals IN_P and IN_N in a low frequency band, the output signals from the second compensation circuit CTLE_L are dominant.

Figure 7A:
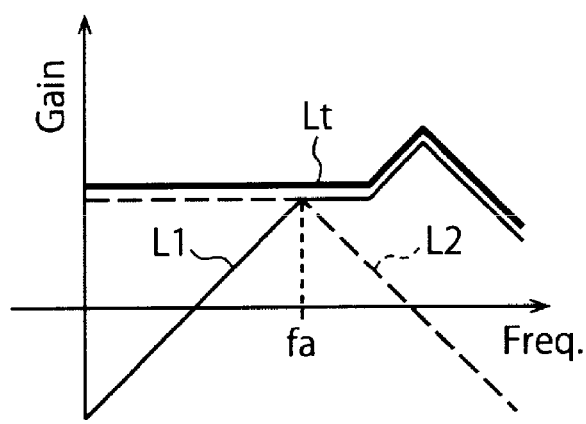
FIGS. 7A and 7B are graphs showing frequency characteristics of the receiving circuit according to the third embodiment.
Figure 7B:
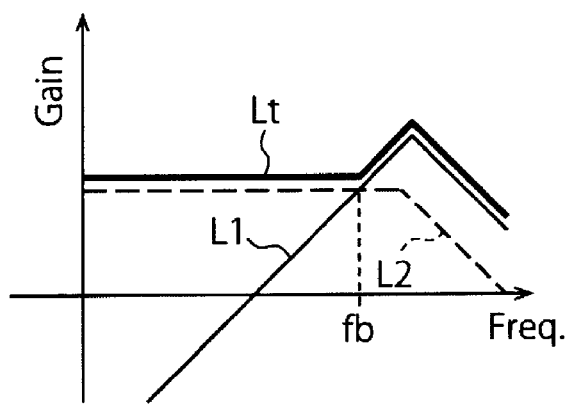

FIGS. 7A and 7B are graphs showing the frequency characteristics of the receiving circuit 13 according to the third embodiment. The vertical axis indicates the gain of the receiving circuit 13. The horizontal axis indicates the frequencies of the received signals IN_P and IN_N. It is to be noted that the scale on the vertical axis is logarithmic.

A line L1 depicted in the graphs indicates the frequency characteristics of the first compensation circuit CTLE_H. A line L2 indicates the frequency characteristics of the second compensation circuit CTLE_L. A line Lt indicates the frequency characteristics of the entire receiving circuit 13, that is, the sum of the frequency characteristics of L1 and L2.

For example, in FIG. 7A, in a frequency band lower than a frequency fa, the output signals from the second compensation circuit CTLE_L are more dominant than the output signals from the first compensation circuit CTLE_H. Therefore, almost all of the output signals of the entire receiving circuit 13 are the output signals from the second compensation circuit CTLE_L. Thus, the line Lt almost totally follows the line L2.

In a frequency band higher than the frequency fa, the output signals from the first compensation circuit CTLE_H are more dominant than the output signals from the second compensation circuit CTLE_L. Therefore, almost all of the output signals of the entire receiving circuit 13 are the output signals from the first compensation circuit CTLE_H. Thus, the line Lt almost totally follows the line L1.

As described above, the first and second compensation circuits CTLE_H and CTLE_L complement their respective frequency characteristics. As a result, the receiving circuit 13 can obtain high and flat gain for a wide frequency band including frequencies corresponding to generations G1 to G4 of PCIe.

For example, in FIG. 7B, in a frequency band lower than a frequency fb, the output signals from the second compensation circuit CTLE_L are more dominant than the output signals from the first compensation circuit CTLE_H. Here, the frequency fb is a frequency higher than the frequency fa. In a frequency band higher than the frequency fb, the output signals from the first compensation circuit CTLE_H are more dominant than the output signals from the second compensation circuit CTLE_L.

Therefore, also in the example depicted in FIG. 7B, the first and second compensation circuits CTLE_H and CTLE_L can complement their respective frequency characteristics. Thus, the receiving circuit 13 can obtain high and flat gain for a wide frequency band including frequencies corresponding to generations G1 to G4 of PCIe. It is to be noted that settings of the frequencies fa and fb can be changed by the capacitance of the first and second AC coupling capacitive elements C1 and C2 or the resistance element R10H, the capacitive element C10H, the resistance element R10L, or the like.

Figure 8:
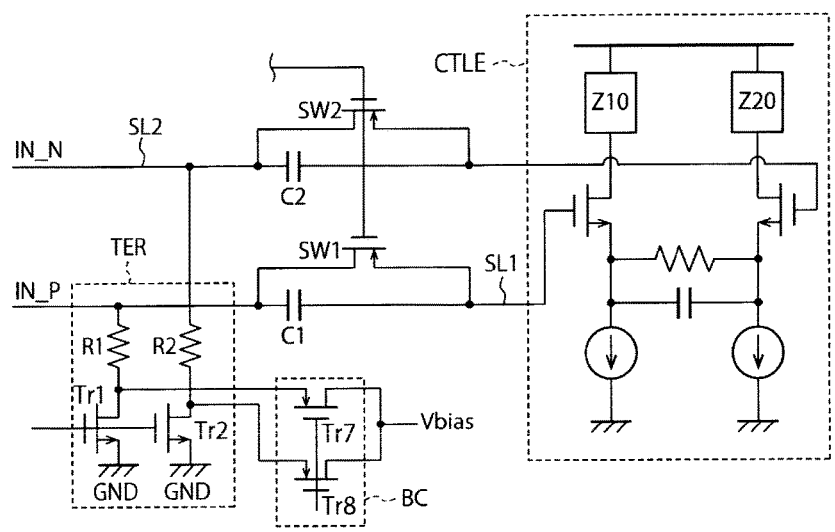
FIG. 8 is a diagram depicting an example of a receiving circuit having a compensation circuit.

If a single compensation circuit CTLE is used as depicted in FIG. 8, the capacitance of the first and second AC coupling capacitive elements C1 and C2 has to be greatly increased so that the first and second AC coupling capacitive elements C1 and C2 can allow a wide range of frequency signals, in particular, to allow signals in a low frequency band to pass therethrough. FIG. 8 is a diagram depicting a receiving circuit of another comparative example having a single compensation circuit CTLE. In this case, if considerably large capacitance is used in the first and second AC coupling capacitive elements C1 and C2, the layout area of the capacitive elements is increased, which makes large the parasitic capacitance of the capacitive elements between the first and second signal lines SL1 and SL2 and the ground GND. Thus, in a high frequency band corresponding to the generations G3 and G4 of the PCIe standard, a loss of frequency characteristics (e.g., gain) is increased.

To address this problem, bypass switches SW1 and SW2 are provided. The bypass switches SW1 and SW2 are connected in parallel with the first and second AC coupling capacitive elements C1 and C2, respectively. The bypass switches SW1 and SW2 transfer signals in a low frequency band to the compensation circuit CTLE at low impedance without the signals passing through the first and second AC coupling capacitive elements C1 and C2. As a result, since the first and second AC coupling capacitive elements C1 and C2 only have to allow signals in a high frequency band to pass therethrough, the capacitance of the first and second AC coupling capacitive elements C1 and C2 can be reduced.

However, although the capacitance of the first and second AC coupling capacitive elements C1 and C2 is reduced, the bypass switches SW1 and SW2 increase the parasitic capacitance of the first and second signal lines SL1 and SL2. Thus, a loss of frequency characteristics for signals in a wide frequency band of the generations G1 to G4 of the PCIe standard is still a significant problem for the receiving circuit depicted in FIG. 8.

By contrast, the compensation circuit according to the third embodiment is divided into the first compensation circuit CTLE_H provided for a high frequency band and the second compensation circuit CTLE_L provided for a low frequency band, which are connected in parallel with each other before and after the first and second AC coupling capacitive elements C1 and C2. As a result, the first and second AC coupling capacitive elements C1 and C2 do not have to allow signals in a low frequency band to pass therethrough and only have to allow signals in a high frequency band to pass therethrough. Therefore, the capacitance of the first and second AC coupling capacitive elements C1 and C2 can be reduced to a minimum. In addition, the bypass switches SW1 and SW2 for bypassing signals in a low frequency band are not needed. Furthermore, the first and second compensation circuits CTLE_H and CTLE_L complement their respective frequency characteristics in a wide frequency band. Thus, the receiving circuit 13 according to the third embodiment can reduce parasitic capacitance and reduce a loss of frequency characteristics for signals in a wide frequency band of the generations G1 to G4 of the PCIe standard.

Part of the configuration of the third embodiment may be combined with part of the configuration of the first or second embodiment. As a result, the third embodiment can obtain the effects similar to those of the first or second embodiment.

It is to be noted that a bias circuit BC is depicted in FIG. 8. The bias circuit BC is connected to a termination circuit TER in order to support the generations G3 and G4 of PCIe. The bias circuit BC includes P-type transistors Tr7 and Tr8 connected to resistance elements R1 and R2. The transistors Tr7 and Tr8 can generate a bias voltage Vbias which is different from the ground GND and apply the bias voltage Vbias to the first and second signal lines SL1 and SL2 located before the first and second AC coupling capacitive elements C1 and C2. As a result, when the receiving circuit is made to support the generations G1 and G2 of PCIe, the termination circuit TER makes the potential of the first and second signal lines SL1 and SL2 equal to the potential of the ground GND. When the receiving circuit is made to support the generations G3 and G4 of PCIe, the bias circuit BC makes the potential of the first and second signal lines SL1 and SL2 located before the first and second AC coupling capacitive elements C1 and C2 equal to the potential of the bias voltage Vbias. In both cases, the input impedance is set at 50 ohms, for example. In such a circuit depicted in FIG. 8, a configuration of the bias circuit BC and control for each generation are needed. However, in the present embodiment, a configuration of the bias circuit BC and control for each generation are not needed and a loss of frequency characteristics for signals in a wide frequency band can be reduced by changing the configuration of the termination circuit TER or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A receiving circuit comprising:
   a first input section and a second input section through which signals are to be received;
   a first signal line and a second signal line that are connected to the first and second input sections, respectively;
   a first circuit connected to the first and second signal lines and including a termination circuit configured to set input impedances of the first and second input sections to a particular value and a self-test circuit configured to generate self-test signals and transmit the self-test signals to the first and second signal lines;
   a first capacitive element and a second capacitive element that are provided in the first and second signal lines, respectively and configured to allow alternating-current components of the received signals to pass therethrough and interrupt at least direct-current components of the received signals from passing through;
   a second circuit connected to the first and second signal lines and configured to boost a gain of the received signals in a certain frequency band that have passed through the first and second capacitive elements; and
   a first output section and a second output section through which the received signals boosted by the second circuit are output.

2. The receiving circuit according to claim 1, wherein the first circuit includes
- a first resistance element and a first transistor that are connected in series between the first signal line and a ground line,
- a second resistance element and a second transistor that are connected in series between the second signal line and the ground line,
- a third transistor connected between a first node, which is located between the first resistance element and the first transistor, and a power supply line,
- a fourth transistor connected between a second node, which is located between the second resistance element and the second transistor, and the power supply line, and
- a logic circuit connected to gate electrodes of the first to fourth transistors, and configured to operate the first transistor and the third transistor in a complementary manner, the second transistor and the fourth transistor in a complementary manner, the first and second transistors concurrently, and the third and fourth transistors concurrently.

3. The receiving circuit according to claim 2, wherein the self-test signals are generated in response to first and second test signals supplied to the logic circuit.

4. The receiving circuit according to claim 2, wherein
the termination circuit includes the first resistance element, the first transistor, the second resistance element, and the second transistor, and
the self-test circuit includes the first, second, third, and fourth transistors.

5. The receiving circuit according to claim 4, wherein
the first and second transistors are N-type MOS transistors, and
the third and fourth transistors are P-type MOS transistors.

6. The receiving circuit according to claim 4, wherein
the first to fourth transistors are N-type MOS transistors.

7. The receiving circuit according to claim 1, wherein
the first circuit connected to the first and second signal lines through third and fourth signal lines, respectively, and
the termination circuit sets the input impedances of the first and second input sections to the particular value through first and second resistive elements provided in the third and fourth signal lines, respectively, and the self-test circuit is configured to transmit the self-test signals to the first and second signal lines through the third and fourth signal lines, respectively.

8. A receiving circuit comprising:
a first input section and a second input section through which signals are to be received;
a first signal line and a second signal line that are connected to the first and second input sections, respectively;
a first circuit connected to the first and second signal lines and configured to set input impedances of the first and second input sections to a particular value;
a first capacitive element and a second capacitive element that are provided in the first and second signal lines, respectively and configured to allow alternating-current components of the received signals to pass therethrough and interrupt direct-current components of the received signals from passing through;
a second circuit connected between a power supply line and a ground line, and configured to boost a gain of the received signals in a first frequency band that have passed through the first and second capacitive elements;
a third circuit that is connected between the power supply line and the ground line in parallel with the second circuit, and configured to boost a gain of the received signals in a second frequency band that have not passed through the first and second capacitive elements, frequencies of the second frequency band being lower than frequencies of the first frequency band; and
a first output section and a second output section through which the received signals in the first frequency band boosted by the second circuit and the received signals in the second frequency band boosted by the third circuit, are output.

9. The receiving circuit according to claim 8, further comprising:
a buffer circuit that is connected between the first and second signal lines and the third circuit and configured to transmit the received signals in the second frequency band to the third circuit.

10. The receiving circuit according to claim 9, wherein:
the second circuit includes
a fifth transistor and a first constant current source that are connected in series between the power supply line and the ground line, and
a sixth transistor and a second constant current source that are connected in series between the power supply line and the ground line;
the third circuit includes
a seventh transistor and a third constant current source that are connected in series between the power supply line and the ground line, and
an eighth transistor and a fourth constant current source that are connected in series between the power supply line and the ground line;
a gate electrode of the fifth transistor is connected to the first capacitive element,
a gate electrode of the sixth transistor is connected to the second capacitive element,
a gate electrode of the seventh transistor is connected to the buffer circuit, and
a gate electrode of the eighth transistor is connected to the buffer circuit.

11. The receiving circuit according to claim 10, wherein the buffer circuit is connected to a first node on the first signal line that is between the first input section and the first capacitive element, and to a second node on the second signal line that is between the second input section and the second capacitive element.

12. The receiving circuit according to claim 10, wherein the buffer circuit includes
a fifth constant current source and a ninth transistor that are connected in series between the power supply line and the ground line, and
a sixth constant current source and a tenth transistor that are connected in series between the power supply line and the ground line,
a gate electrode of the ninth transistor is connected to the first node that is on the first signal line,
a gate electrode of the tenth transistor is connected to the second node that is on the second signal line,
a third node between the fifth constant current source and the ninth transistor is connected to the gate electrode of the seventh transistor, and a fourth node between the sixth constant current source and the tenth transistor is connected to the gate electrode of the eighth transistor.

13. The receiving circuit according to claim 12, wherein the gate electrode of the seventh transistor is connected to the third node, and a gate electrode of the eighth transistor is connected to the fourth node.

14. The receiving circuit according to claim 8, wherein the first circuit includes a termination circuit configured to set the input impedances of the first and second input sections to the particular value and a self-test circuit configured to generate self-test signals and transmit the self-test signals to the first and second signal lines.

15. The receiving circuit according to claim 14, wherein the first circuit includes
- a first resistance element and a first transistor that are connected in series between the first signal line and a ground line,
- a second resistance element and a second transistor that are connected in series between the second signal line and the ground line,
- a third transistor connected between a first node, which is located between the first resistance element and the first transistor, and a power supply line,
- a fourth transistor connected between a second node, which is located between the second resistance element and the second transistor, and the power supply line, and
- a logic circuit connected to gate electrodes of the first to fourth transistors, and configured to operate the first transistor and the third transistor in a complementary manner, the second transistor and the fourth transistor in a complementary manner, the first and second transistors concurrently, and the third and fourth transistors concurrently.

16. The receiving circuit according to claim 15, wherein the self-test signals are generated in response to first and second test signals supplied to the logic circuit.

17. The receiving circuit according to claim 15, wherein the termination circuit includes the first resistance element, the first transistor, the second resistance element, and the second transistor, and the self-test circuit includes the first, second, third, and fourth transistors.

18. The receiving circuit according to claim 17, wherein the first and second transistors are N-type MOS transistors, and the third and fourth transistors are P-type MOS transistors.

19. The receiving circuit according to claim 17, wherein the first to fourth transistors are N-type MOS transistors.

20. The receiving circuit according to claim 8, further comprising:
- a self-test circuit configured to generate self-test signals and transmit the self-test signals to the first and second signal lines.

* * * * *